(12) United States Patent
Kim et al.

(10) Patent No.: US 7,723,208 B2
(45) Date of Patent: May 25, 2010

(54) INTEGRATED RE-COMBINER FOR ELECTROOSMOTIC PUMPS USING POROUS FRITS

(75) Inventors: Sarah E. Kim, Portland, OR (US); R. Scott List, Beaverton, OR (US); James G. Maveety, San Jose, CA (US); Alan M. Myers, Portland, OR (US); Quat T. Vu, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 967 days.

(21) Appl. No.: 10/669,205

(22) Filed: Sep. 24, 2003

(65) Prior Publication Data

US 2005/0074953 A1 Apr. 7, 2005

(51) Int. Cl.
*H01L 21/30* (2006.01)
(52) U.S. Cl. ............................... 438/456; 257/E23.098
(58) Field of Classification Search .................. 438/26, 438/51, 98, 100, 101, 106, 107, 597, 653, 438/669, 670, 685–687, 692, 422, 424, 456; 257/E23.098
See application file for complete search history.

(56) References Cited

U.S. PATENT DOCUMENTS

| | | | | |
|---|---|---|---|---|
| 5,057,908 A * | 10/1991 | Weber | ......................... | 257/714 |
| 5,293,070 A * | 3/1994 | Burgess et al. | .............. | 257/714 |
| 5,580,435 A * | 12/1996 | Kovacs | ...................... | 204/603 |
| 5,727,618 A * | 3/1998 | Mundinger et al. | ........ | 165/80.4 |
| 6,301,109 B1 * | 10/2001 | Chu et al. | .................... | 361/690 |
| 6,406,636 B1 * | 6/2002 | Vaganov | ........................ | 216/2 |
| 6,443,704 B1 * | 9/2002 | Darabi et al. | ................. | 417/50 |
| 6,500,694 B1 * | 12/2002 | Enquist | ...................... | 438/109 |
| 6,533,554 B1 * | 3/2003 | Vargo et al. | ................. | 417/207 |
| 6,551,838 B2 * | 4/2003 | Santini et al. | ............... | 436/174 |
| 6,607,981 B1 * | 8/2003 | Takahashi et al. | ........... | 438/678 |
| 6,627,531 B2 * | 9/2003 | Enquist | ...................... | 438/622 |
| 6,629,425 B2 * | 10/2003 | Vaiyapuri | .................. | 62/259.2 |
| 6,641,948 B1 * | 11/2003 | Ohlsen et al. | ................. | 429/44 |
| 6,670,257 B1 * | 12/2003 | Barlocchi et al. | ........... | 438/422 |
| 6,764,874 B1 * | 7/2004 | Zhang et al. | .................. | 438/99 |
| 6,864,571 B2 * | 3/2005 | Arik et al. | .................... | 257/712 |
| 6,981,849 B2 * | 1/2006 | Kim et al. | ...................... | 417/50 |
| 6,992,381 B2 * | 1/2006 | Kim et al. | .................... | 257/713 |

(Continued)

OTHER PUBLICATIONS

List et al., U.S. Appl. No. 10/402,435, filed Mar. 28, 2003, entitled "Electroosmotic Pump Using Nanoporous Dielectric Frit".

(Continued)

*Primary Examiner*—Charles D Garber
*Assistant Examiner*—Stanetta D Isaac
(74) *Attorney, Agent, or Firm*—Trop, Pruner & Hu, P.C.

(57) ABSTRACT

Trenches may be formed in the upper surfaces of a pair of wafers. Each trench may be coated with a catalyst that is capable of removing oxygen or hydrogen from a fluid used for cooling in a system making use of the electroosmotic effect for pumping. Channels may be formed to communicate fluid to and from the trench coated with the catalyst. The substrates may be combined in face-to-face abutment, for example using copper-to-copper bonding to form a re-combiner.

3 Claims, 8 Drawing Sheets

U.S. PATENT DOCUMENTS

| | | | |
|---|---|---|---|
| 2002/0028372 A1* | 3/2002 | Ohlsen et al. | 429/40 |
| 2002/0055203 A1* | 5/2002 | Komobuchi et al. | 438/122 |
| 2002/0163781 A1* | 11/2002 | Bartola et al. | 361/699 |
| 2003/0062149 A1 | 4/2003 | Goodson et al. | 165/104.11 |
| 2003/0164231 A1 | 9/2003 | Goodson et al. | 165/104.11 |
| 2004/0067604 A1* | 4/2004 | Ouellet et al. | 438/108 |
| 2004/0072039 A1* | 4/2004 | Jankowski et al. | 429/19 |
| 2004/0120827 A1* | 6/2004 | Kim et al. | 417/48 |
| 2004/0135656 A1* | 7/2004 | Sinsheimer et al. | 333/238 |
| 2004/0137730 A1* | 7/2004 | Kim et al. | 438/689 |
| 2004/0185323 A1* | 9/2004 | Fowler et al. | 429/38 |
| 2005/0003664 A1* | 1/2005 | Ramanathan et al. | 438/689 |
| 2005/0006754 A1* | 1/2005 | Arik et al. | 257/712 |

OTHER PUBLICATIONS

Kim et al., U.S. Appl. No. 10/687,127, filed Oct. 16, 2003, entitled "Electroosmotic Pumps Using Porous Frits for Cooling Integrated Circuit Stacks".

Kim et al., U.S. Appl. No. 10/698,749, filed Oct. 31, 2003, entitled "Using External Radiators with Electroosmotic Pumps for Cooling Integrated Circuits".

List et al., U.S. Appl. No. 10/402,435, filed Mar. 28, 2003, entitled "Electroosmotic Pump Using Nanoporous Dielectric Frit".

Kim et al., U.S. Appl. No. 10/323,084, filed Dec. 18, 2002, entitled "Electro-Osomotic Pumps and Micro-Channels".

Kim et al., U.S. Appl. No. 10/315,565, filed Dec. 9, 2002, entitled Cooling Micro-Channels.

* cited by examiner

INTEGRATED RE-COMBINER FOR ELECTROOSMOTIC PUMPS USING POROUS FRITS

BACKGROUND

This invention relates generally to electroosmotic pumps and, particularly, to such pumps fabricated in silicon using semiconductor fabrication techniques.

Electroosmotic pumps use electric fields to pump a fluid. In one application, they may be fabricated using semiconductor fabrication techniques. They then may be applied to the cooling of integrated circuits, such as microprocessors.

For example, an integrated circuit electroosmotic pump may be operated as a separate unit to cool an integrated circuit. Alternatively, the electroosmotic pump may be formed integrally with the integrated circuit to be cooled. Because the electroosmotic pumps, fabricated in silicon, have an extremely small form factor, they may be effective at cooling relatively small devices, such as semiconductor integrated circuits.

One issue with electroosmotic systems is the build up of hydrogen and oxygen gas in the cooling fluid. Existing techniques for forming re-combiners result in bulky structures.

Thus, there is a need for better ways of providing recombines for cooling integrated circuits.

DETAILED DESCRIPTION

Figure 1:
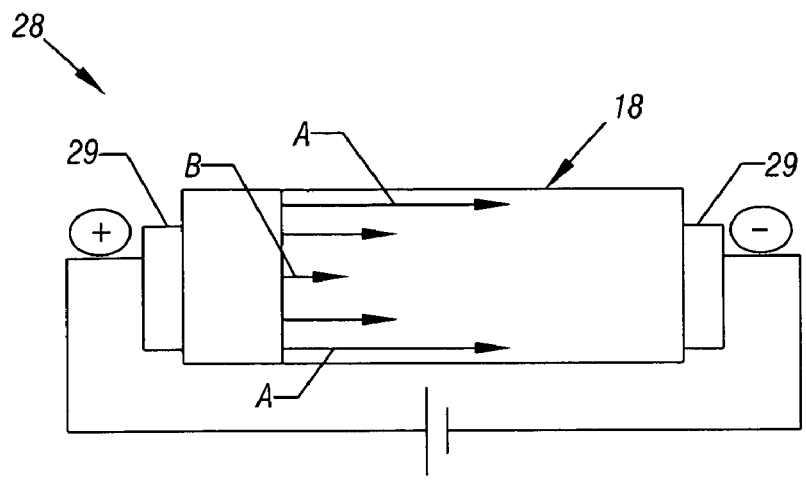
FIG. 1 is a schematic depiction of the operation of the embodiment in accordance with one embodiment of the present invention.

Referring to FIG. 1, an electroosmotic pump 28 fabricated in silicon is capable of pumping a fluid, such as a cooling fluid, through a frit 18. The frit 18 may be coupled on opposed ends to electrodes 29 that generate an electric field that results in the transport of a liquid through the frit 18. This process is known as the Electroosmotic effect. The liquid may be, for example, water and the frit may be composed of silicon dioxide in one embodiment. In this case hydrogen from hydroxyl groups on the wall of the frit deprotonate resulting in an excess of protons moving transversely to the wall or transversely to the direction of fluid movement, indicated by the arrows A. The hydrogen ions move in response to the electric field applied by the electrodes 29 in the direction of the arrows A. The non-charged water atoms also move in response to the applied electric field because of drag forces that exist between the ions and the water atoms.

As a result, a pumping effect may be achieved without any moving parts. In addition, the structure may be fabricated in silicon at extremely small sizes making such devices applicable as pumps for cooling integrated circuits.

In accordance with one embodiment of the present invention, the frit 18 may be made of an open and connected cell dielectric thin film having open nanopores. By the term "nanopores," it is intended to refer to films having pores on the order of 10 to 100 nanometers. In one embodiment, the open cell porosity may be introduced using the sol-gel process. In this embodiment, the open cell porosity may be introduced by burning out the porogen phase. However, any process that forms a dielectric film having interconnected or open pores on the order of 10 to 100 nanometers may be suitable in some embodiments of the present invention.

For example, suitable materials may be formed of organosilicate resins, chemically induced phase separation, and sol-gels, to mention a few examples. Commercially available sources of such products are available from a large number of manufacturers who provide those films for extremely low dielectric constant dielectric film semiconductor applications.

In one embodiment, an open cell xerogel can be fabricated with 20 nanometer open pore geometries that increase maximum pumping pressure by a few orders of magnitude. The xerogel may be formed with a less polar solvent such as ethanol to avoid any issues of water tension attacking the xerogel. Also, the pump may be primed with a gradual mix of hexamethyldisilazane (HMDS), ethanol and water to reduce the surface tension forces. Once the pump is in operation with water, there may be no net forces on the pump sidewalls due to surface tension.

Referring to FIGS. 2-9, the fabrication of an integrated electroosmotic pump 28 using a nanoporous open cell dielectric frit 18 begins by patterning and etching to define an electroosmotic trench.

Figure 2:
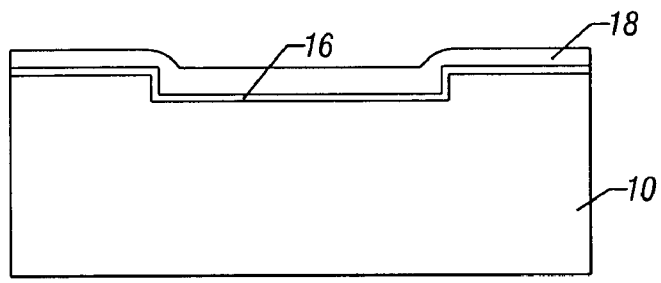
FIG. 2 is an enlarged cross-sectional view of one embodiment of the present invention at an early stage of manufacture.

Referring to FIG. 2, a thin dielectric layer 16 may be grown over the trench in one embodiment. Alternatively, a thin etch or polish-stop layer 16, such as a silicon nitride, may be formed by chemical vapor deposition. Other techniques may also be used to form the thin dielectric layer 16. The nanoporous dielectric layer 18 may than be formed, for example, by spin-on deposition. In one embodiment, the dielectric layer 18 may be in the form of a sol-gel. The deposited dielectric layer 18 may be allowed to cure.

Figure 3:
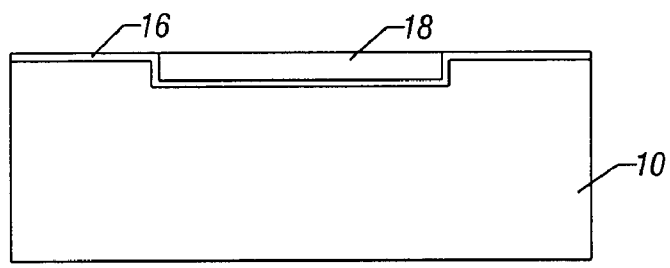
FIG. 3 is an enlarged cross-sectional view at a subsequent stage of manufacture in accordance with one embodiment of the present invention.

Then, referring to FIG. 3, the structure of FIG. 2 may be polished or etched back to the stop layer 16. As a result, a nanoporous dielectric frit 18 may be defined within the layer 16, filling the substrate trench.

Figure 4:
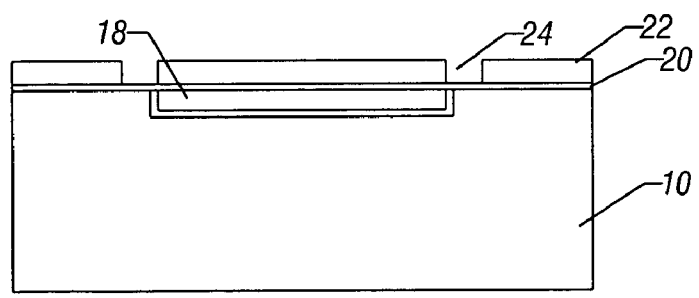
FIG. 4 is an enlarged cross-sectional view at a subsequent stage of manufacture in accordance with one embodiment of the present invention.

Referring next to FIG. 4, openings 24 may be defined in a resist layer 22 in one embodiment of the present invention. The openings 24 may be effective to enable electrical connections to be formed to the ends of the frit 18. Thus, the openings 24 may be formed down to a deposited oxide layer 20 that may encapsulate the underlying frit 18. In some embodiments, the deposited oxide layer 20 may not be needed.

Figure 5:
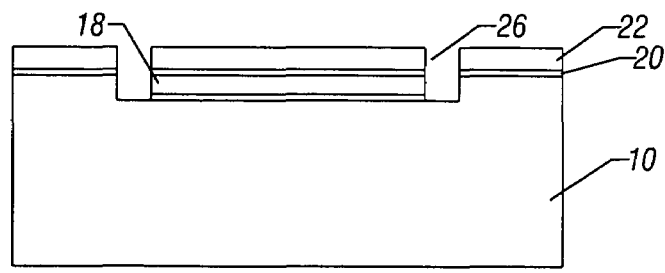
FIG. 5 is an enlarged cross-sectional view at a subsequent stage of manufacture in accordance with one embodiment of the present invention.
Figure 6:
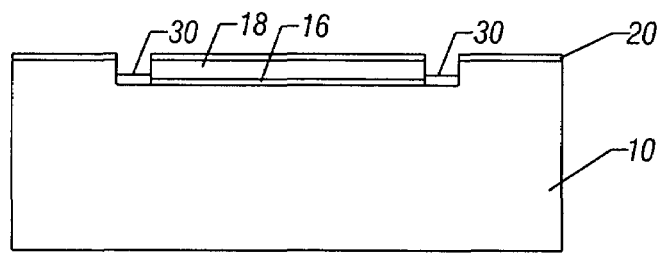
FIG. 6 is an enlarged cross-sectional view at a subsequent stage of manufacture in accordance with one embodiment of the present invention.

The resist 22 is patterned as shown in FIG. 4, the exposed areas are etched and then used as a mask to form the trenches 26 alongside the nanoporous dielectric layer 18 as shown in FIG. 5. Once the trenches 26 have been formed, a metal 29 may be deposited on top of the wafer In one emobodiment, sputtering can be used to deposit the metal. The metal 29 can be removed by etching or lift-off techniques in such a manner as to leave metal only in the trench at the bottom of the trenches 26 as shown in FIG. 6. The metal 29 is advantageously made as thin as possible to avoid occluding liquid access to the exposed edge regions of the frit 18, which will ultimately act as the entrance and exit openings to the pump 28. The metal 30 may be thick enough, however, to assure adequate current flow without damage to the electrodes. Additionally, it is advantageous if the metal 29 also is deposited along the edges of the frit to a thickness which does not block the pore openings. This assures a uniform electric field along the entire depth of the frit.

Figure 7:
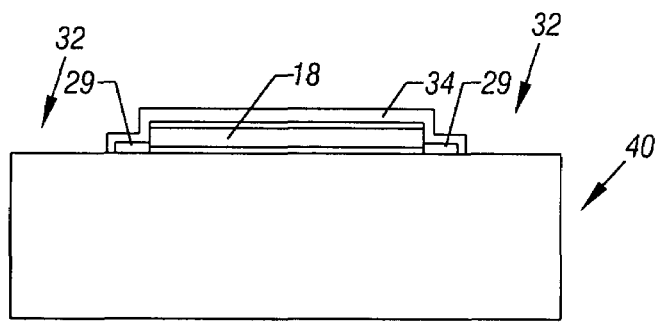
FIG. 7 is an enlarged cross-sectional view taken along the lines 7-7 in FIG. 8 at a subsequent stage of manufacture in accordance with one embodiment of the present invention.
Figure 8:
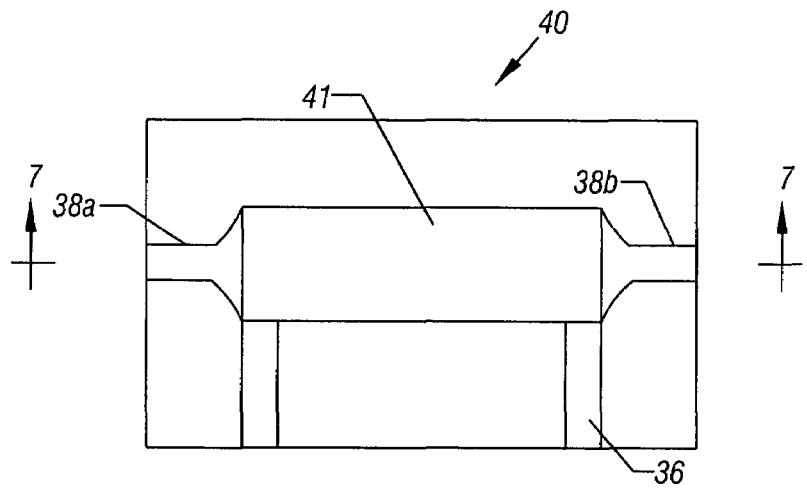
FIG. 8 is a top plan view of the embodiment shown in FIG. 8 in accordance with one embodiment of the present invention.

Referring to FIG. 7, a chemical vapor deposition material 34 may be formed over the frit 18 and may be patterned with photoresist and etched, as indicated at 32, to provide for the formation of microchannels 38 shown in FIG. 8. The microchannels 38 act as conduits to convey liquid to and from the rest of the pump 41. Also, electrical interconnections 36 may be fabricated by depositing metal (for example by sputtering), and removing the metal in selected areas (for example by lithographic patterning and etching across the wafer to enable electrical current to be supplied to the electrodes 29. This current sets up an electric field that is used to draw the fluid through the pump 28.

Figure 9:
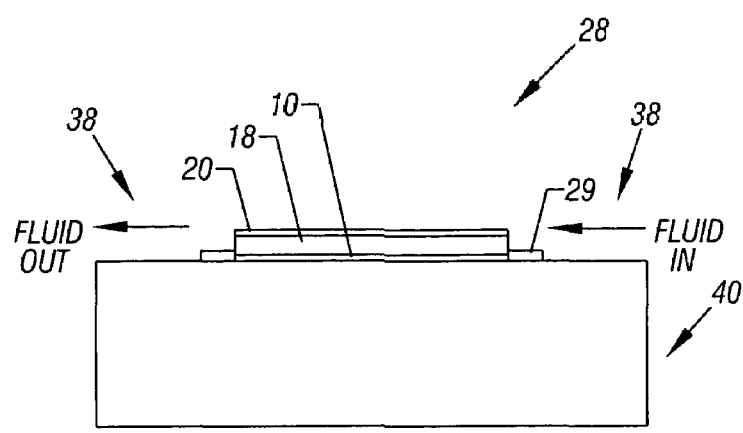
FIG. 9 is an enlarged cross-sectional view of a completed structure in accordance with one embodiment of the present invention.

Referring to FIG. 9, the fluid may pass through the microchannels 38 and enter the frit 18 by passing over the first electrode 29. The fluid is drawn through the frit 18 by the electric field and the disassociation process described previously. As a result, the fluid, which may be water, is pumped through the pump 28.

Figure 10:
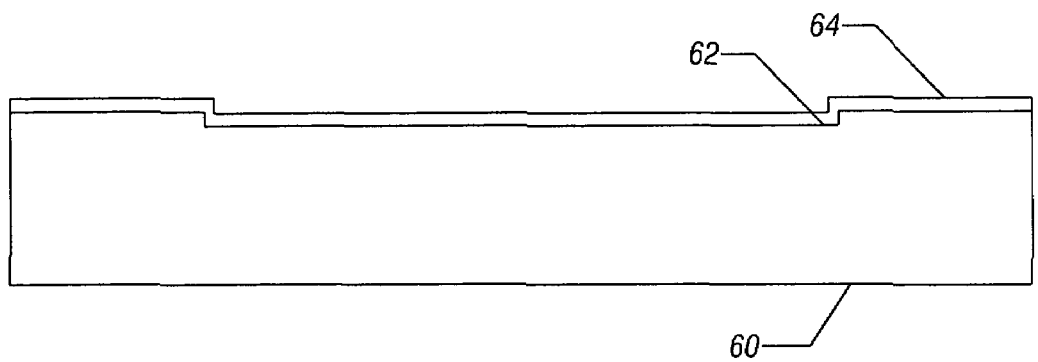
FIG. 10 is a depiction of a combiner at an early stage of manufacture.
Figure 11:
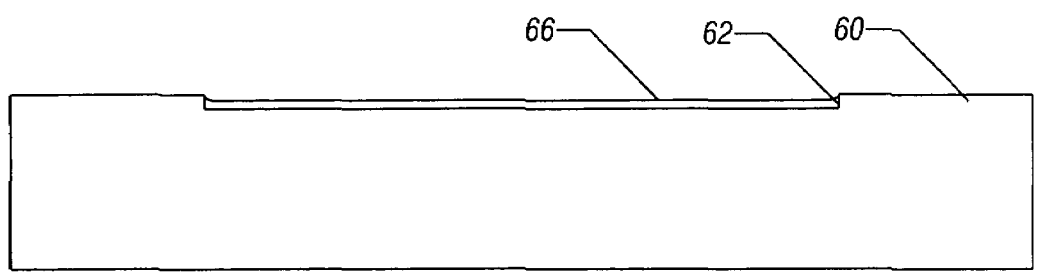
FIG. 11 is an enlarged cross-sectional view at a subsequent stage of manufacture in accordance with one embodiment of the present invention.
Figure 12:
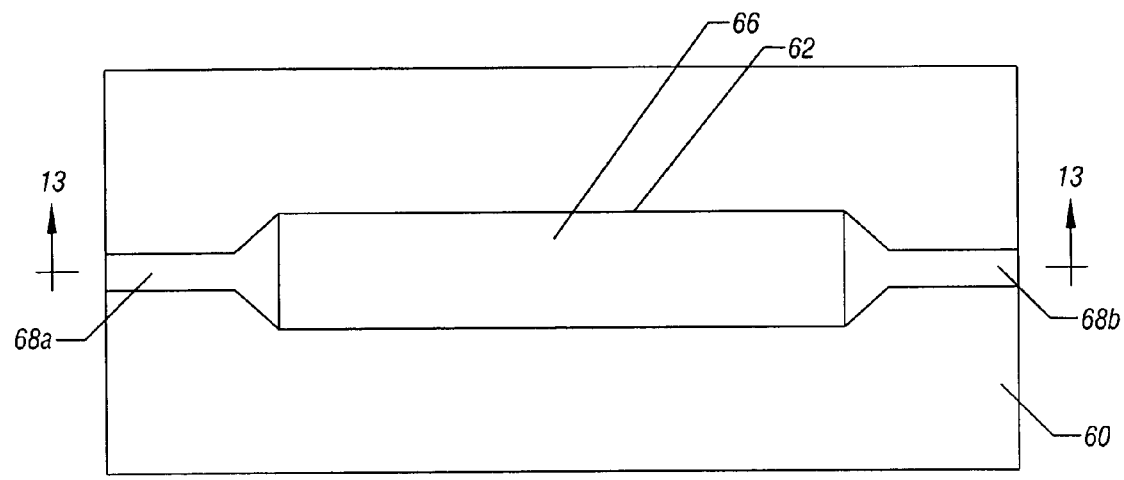
FIG. 12 is an enlarged top plan view at a subsequent stage of manufacture in accordance with one embodiment of the present invention.

Referring now to FIGS. 10 through 17, one embodiment of a fabrication technique for making an integrated re-combiner is illustrated. Initially, a semiconductor substrate 60, such as a silicon wafer, may have a trench 62 formed therein by patterning and etching techniques, for example. Thereafter, a catalyst material 64, such as platinum or lead, is sputter deposited as shown in FIG. 10. The catalyst material 64 is polished off the top of the wafer substrate 60 so only the portion 66 remains as shown in FIG. 11. A resist may be spun-on and patterned to form microchannels 68a and 68b, shown in FIGS. 12 and 13.

Figure 14:
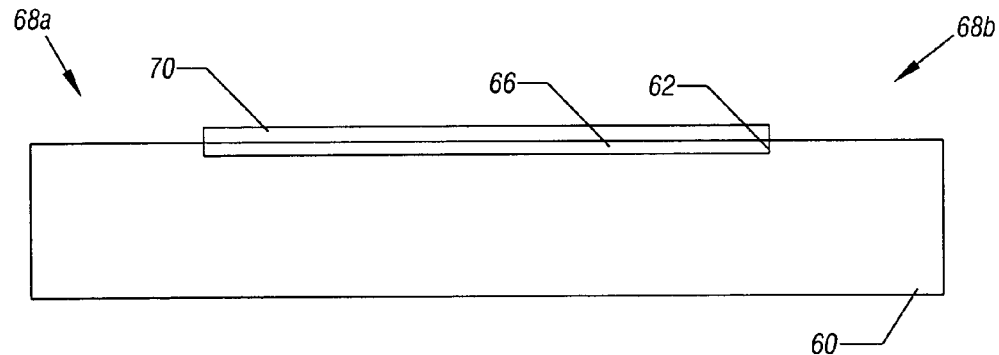
FIG. 14 is an enlarged cross-sectional view at a subsequent stage of manufacture in accordance with one embodiment of the present invention.
Figure 15:
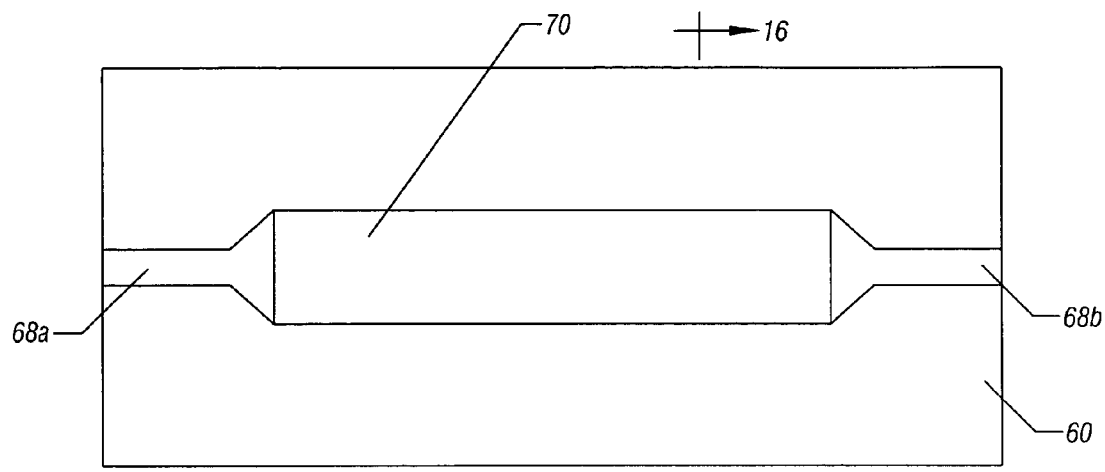
FIG. 15 is a top plan view of the embodiment shown in FIG. 14 at a subsequent stage of manufacture in accordance with one embodiment of the present invention.
Figure 16:
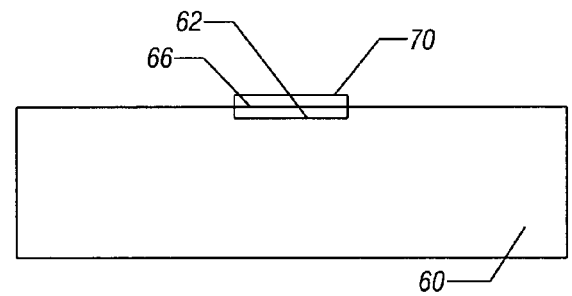
FIG. 16 is a cross-sectional view taken generally along the line 16-16 in FIG. 15 in accordance with one embodiment of the present invention.
Figure 17:
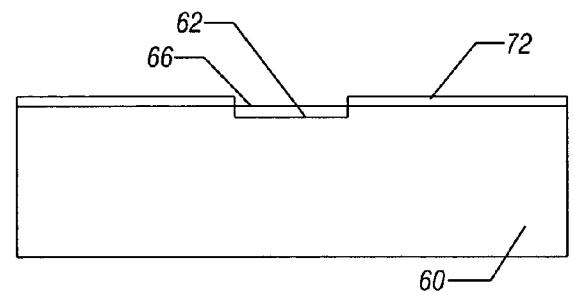
FIG. 17 is a cross-sectional view corresponding to FIG. 16 at a subsequent stage of manufacture in accordance with one embodiment of the present invention.

The microchannels 68a and 68b may be etched to the depth of the top of the catalyst material 66 and the resist used to do the etching may be cleaned. Then a resist 70 may be spun-on and ashed to clear the top of the wafer substrate 60, as shown in FIG. 14. A barrier, such as TiTiN, and copper 72 may be sputtered on top of the wafer substrate 60. A resist lift off may be used to remove the copper from the top of the catalyst material 66 and the microchannels 68a and 68b as shown in FIG. 17.

A porous Teflon layer (not shown) may be deposited over the wafer surface and either etched back or polished so that the Teflon covers the catalyst material 66 while having the copper 72 exposed. The Teflon layer protects the catalyst material 66 if re-combined gas turns into water.

Figure 17A:
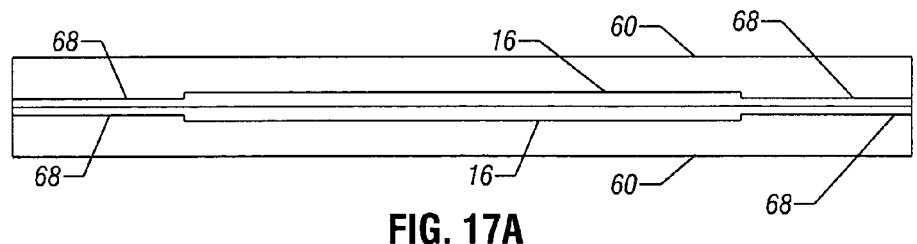
FIG. 17A is a side-elevational view of a re-combiner in accordance with one embodiment of the present invention.

A pair of identical substrates 60, processed as described above, may then be combined in face-to-face abutment to form a re-combiner 30 as shown in FIG. 17A. The substrates 60 may be joined by copper-to-copper bonding where there is no trench 16 or channel 68. The trenches 16 and channels 68 may be aligned to form a passage for cooling fluid circulation over the catalyst material 66.

The re-combiner 30 may be used to reduce the buildup of gas in the cooling fluid pumped by the pump 28. Exposure of the gases to catalytic material 66 results in gas recombination. The re-combiner 30 may be made deep enough to avoid being covered with water formed from recombined gas.

Figure 18:
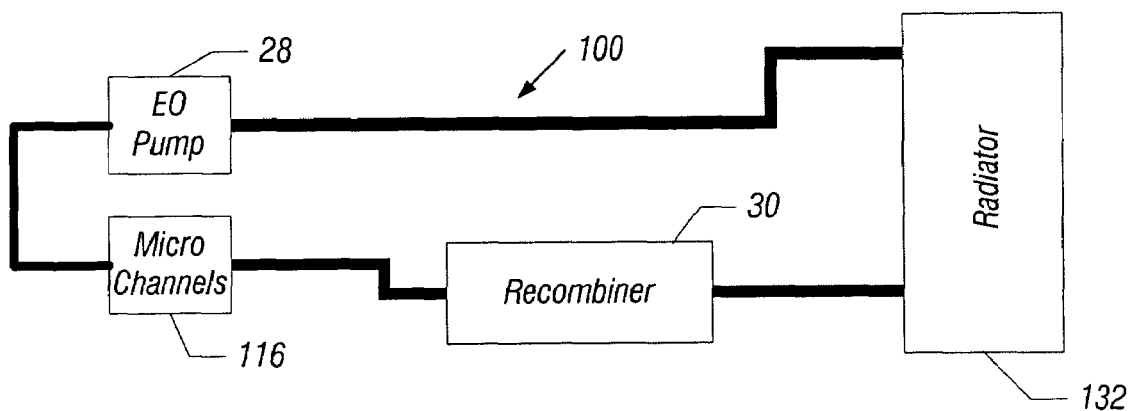
FIG. 18 is a schematic depiction of a packaged system in accordance with one embodiment of the present invention.

The electroosmotic pump 28 may be provided in a system 100 coupled by fluid passageways as indicated in FIG. 18. The passageways couple a radiator 132, a re-combiner 30, and a set of microchannels 116 in a circuit or pathway for fluid. Thus, the fluid pumped by the pump 28 passes through the channel 116 and the re-combiner 30 to the radiator 132 where heat is removed to the surrounding environment. Thus, the microchannel 116 associated with an integrated circuit not shown in FIG. 10, provide cooling to an integrated circuit.

Figure 19:
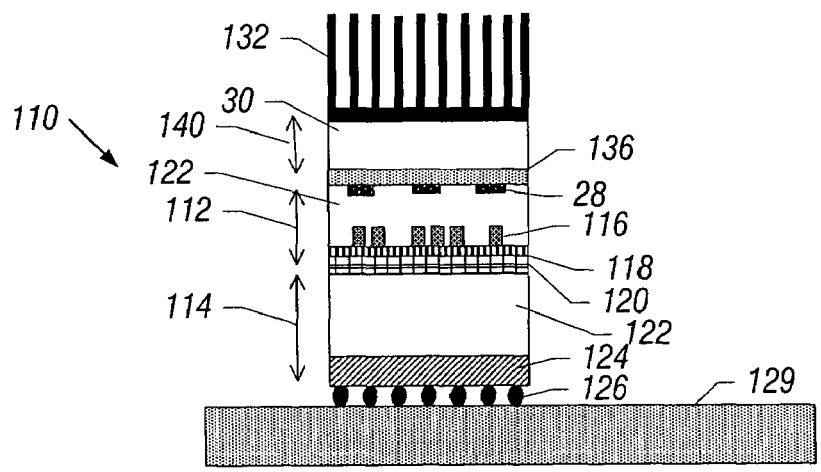
FIG. 19 is a cross-sectional view of a packaged system in accordance with one embodiment of the present invention.

Referring to FIG. 19, a surface mount or flip-chip package 129 may support an integrated circuit 124 having bump connections 126 to the package 129. Thus, the top side of the integrated circuit 124 faces towards the package 129.

Thus, the die 114 active semiconductor 124 is underneath the bulk silicon 122. The die 114 may be coupled to another die 112 by a copper-to-copper connection 120. That is, copper metal 120 on each die 112 and 114 may be fused to connect the dice 112 and 114. The die 112 may be bonded by glass, polymers, or dielectric bonding to the die 140.

The die 112 may include a dielectric layer 118 and a plurality of microchannels 116, which circulate cooling fluid. On the opposite side of the die 112 are a plurality of electroosmotic pumps 28 formed as described previously. A dielectric layer 136 couples the die 112 to a die 140, which forms the re-combiner 30. The re-combiner/condenser 30 may be coupled to a radiator 132 such as a finned heat exchanger.

Thus, fluid may be circulated by the pumps 28 through the microchannels 116 to cool the die 114 active semiconductor 124. That fluid may be passed upwardly through appropriate passageways in the die 112 to the electroosmotic pumps 28. A pump liquid may then be communicated by appropriate passageways to the re-combiner/condenser 30.

In some embodiments, by providing a vertical stack of three dice, a compact footprint may be achieved in a conventional package 129. The re-combiner 30 may be thermally insulated by the dielectric layer 136 from the lower, heat producing components.

Figure 20:
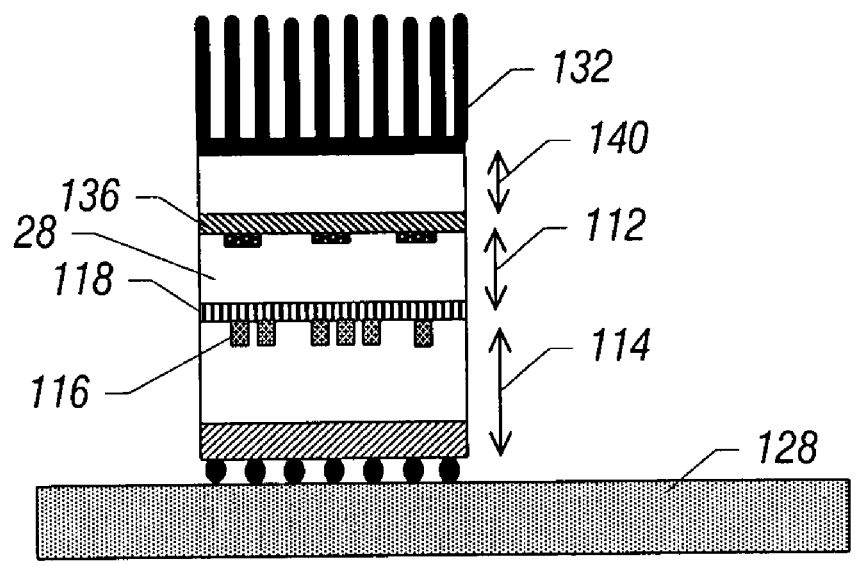
FIG. 20 is a cross-sectional view of a packaged system in accordance with another embodiment of the present invention.

Referring to FIG. 20, the structure shown therein corresponds in most respects to the structure shown in FIG. 11. The only difference is that the copper-to-copper bonding is eliminated. In this case, a glass, polymer, or dielectric bond process may be utilized to connect the dice 112 and 114, as well as the dice 112 and 140.

Figure 21:
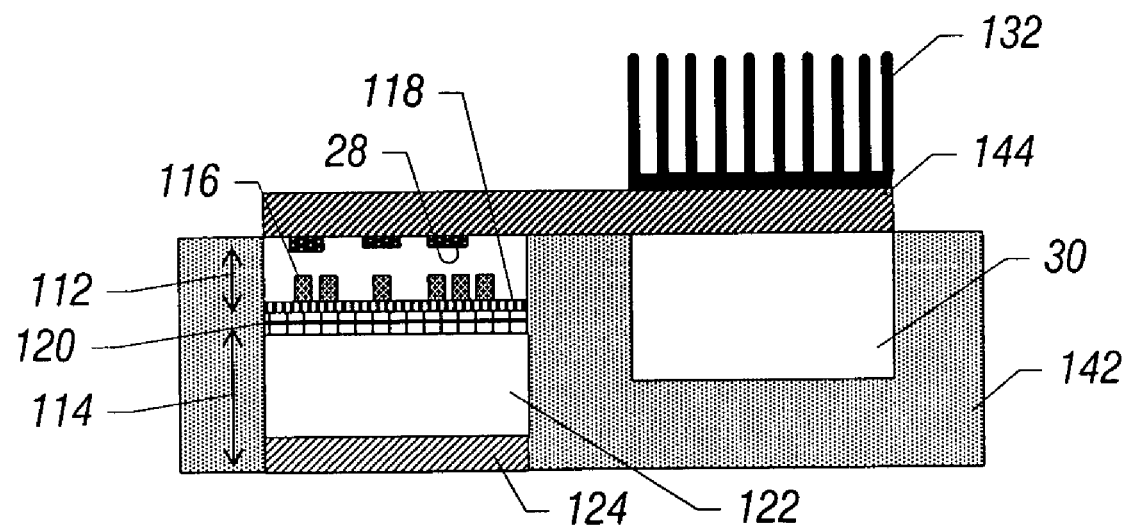
FIG. 21 is a cross-sectional view of a packaged system in accordance with another embodiment of the present invention.

Referring to FIG. 21, a bumpless build-up layer (BBUL) package 142 is illustrated. The package 142 has build-up layers because the package is 'grown' (built up) around the silicon die, rather than being manufactured separately and bonded to it. Bumpless build-up layer packaging is similar to flip-chip packaging except that no bumps are utilized and the device or core is embedded with the package. The build-up layer 144 provides multiple metal interconnection layers that enable electrical connections between the package pins and contacts on the dice 12 and 14 without the need for bumps.

The dice 112 and 114 are separately fabricated and, in this case, are bonded by a copper/copper bond as illustrated. The re-combiner 30 is inserted in the BBUL package 142 separately from the stack of the dice 112 and 114. A build-up layer 144 may be provided between the BBUL package 142 and the radiator 132. The build-up layer 144 serves to couple the re-combiner 30 to the stack including the dice 112 and 114.

Figure 22:
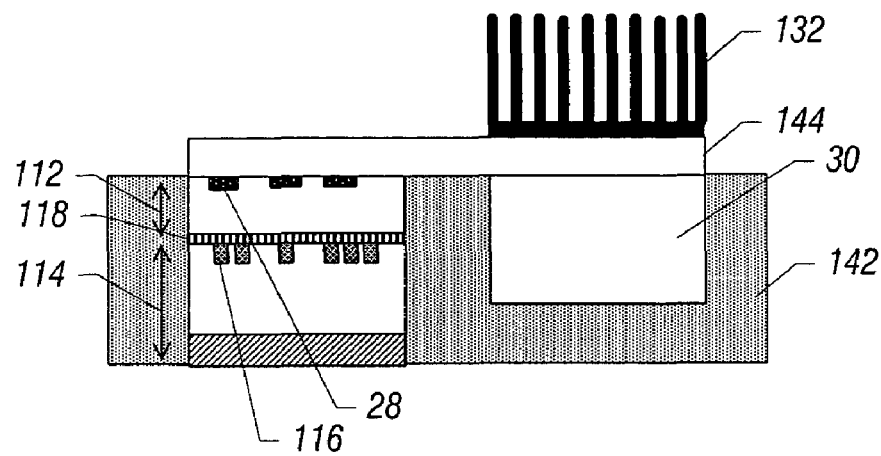
FIG. 22 is a cross-sectional view of a package system in accordance with another embodiment of the present invention.

Referring to FIG. 22, the structure therein corresponds to the structure shown in FIG. 13 but, again, the copper-to-copper bonding between the dice 112 and 114 is replaced with either polymer, dielectric, or glass bonding processes.

Figure 13:
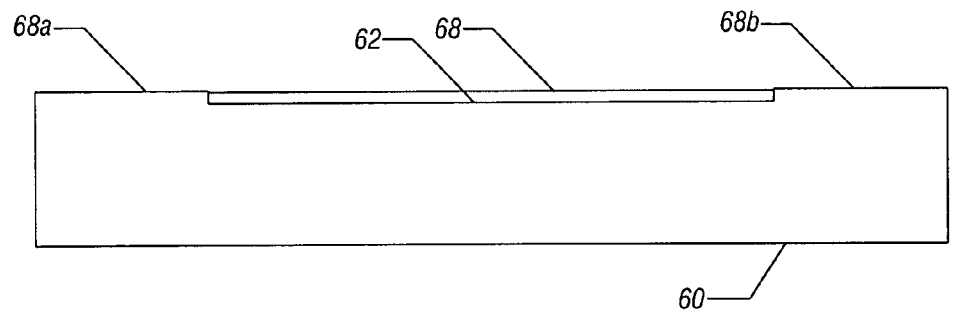
FIG. 13 is a cross-sectional view taken general along the line 13-13 in FIG. 12 in accordance with one embodiment of the present invention.
Figure 23:
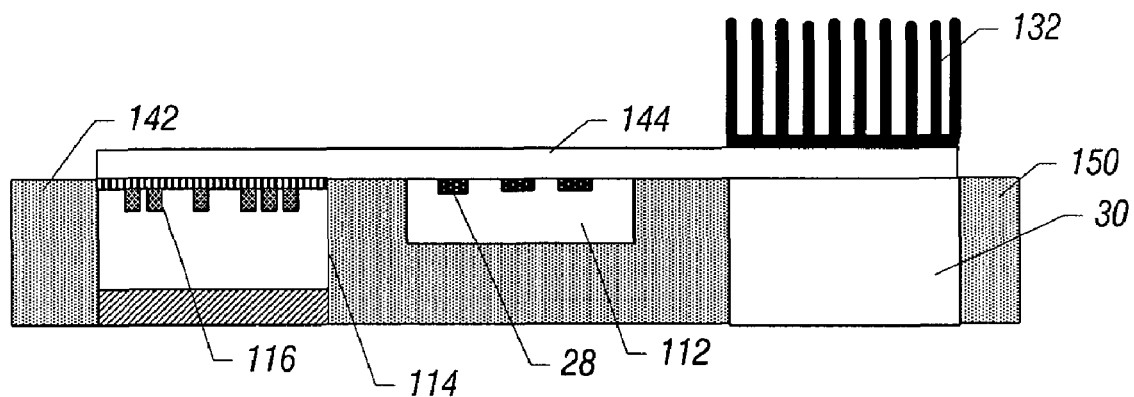
FIG. 23 is a cross-sectional view of still another embodiment of the present invention.

Referring next to FIG. 23, a BBUL package 142 corresponds to the embodiment shown in FIG. 13, except that the dice 112 and 114 are not stacked. A build-up layer 144 couples the die 112 to the die 116 and the re-combiner 30.

Via channels may be used to couple the dice 112, 114, and 140. Alternatively, channels or tubes may be utilized for this purpose. The channels or tubes may be formed in the same structure or may be separate structures physically joined to the dies 112, 114, and 140 for this purpose.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a trench in an integrated circuit substrate;
   lining the trench with a catalyst material to remove gases from a circulating fluid;
   forming channels that align with said trench to allow fluid circulation completely across said substrate from one side of said substrate to the other and through said trench; and
   protecting said catalyst when forming said channels.

2. The method of claim 1 including depositing platinum as said catalyst in said trench.

3. The method of claim 1 including depositing lead in said trench as said catalyst.

* * * * *